United States Patent [19]
Ishida et al.

[11] Patent Number: 4,891,095
[45] Date of Patent: Jan. 2, 1990

[54] METHOD AND APPARATUS FOR PLASMA TREATMENT

[75] Inventors: Tomoaki Ishida; Kyusaku Nishioka, both of Itami, Japan

[73] Assignee: Mitsubishi Denki Kabushiki Kaisha, Japan

[21] Appl. No.: 325,917

[22] Filed: Mar. 20, 1989

[30] Foreign Application Priority Data

Jul. 15, 1988 [JP] Japan .................. 63-177511

[51] Int. Cl.⁴ ............... H01L 21/306; B44C 1/22; C23C 14/00; B05B 5/02
[52] U.S. Cl. ........................ 156/643; 118/50.1; 118/623; 118/728; 156/646; 156/345; 204/192.32; 204/298; 204/192.1
[58] Field of Search ............ 156/643, 646, 662, 345; 204/192.1, 192.32, 192.35, 192.37, 298 ME, 298 EE; 118/728, 50.1, 620, 623; 427/38, 39

[56] References Cited
U.S. PATENT DOCUMENTS
4,776,918 10/1988 Otsubo et al. ............... 156/345

Primary Examiner—William A. Powell
Attorney, Agent, or Firm—Leydig, Voit & Mayer

[57] ABSTRACT

A mirror field which faces a surface of a specimen to be treated and which has its field axis parallel to the specimen surface is formed in an atmosphere in a reactive gas, and a plasma of the reactive gas is then generated by introducing microwave energy into a region where the mirror field is formed, the thus-formed plasma being confined by the mirror field. The specimen is then treated by activated neutral particles which are produced by the plasma to the surface of the specimen. Preferably, an electric field is formed in the direction along the field axis of the mirror field in a region where the plasma is generated.

16 Claims, 2 Drawing Sheets

METHOD AND APPARATUS FOR PLASMA TREATMENT

BACKGROUND OF THE INVENTION

1. Field of the Invention

The present invention relates to a method and an apparatus for etching or forming a thin film using plasma in a process of producing a semiconductor device.

2. Description of the Related Art

FIG. 1 shows an example of this sort of conventional apparatus for plasma treatment. A specimen supporting base 3 is provided in a treatment chamber 2 which is formed in a container 1. A pair of electrodes 5a and 5b are disposed outside the container 1 with the container held therebetween, a high frequency power source 6 being connected to the two electrodes 5a and 5b. Gas inlet ports 7 for introducing a reactive gas into the container 1 are formed at one end of the container 1 and a gas outlet port 8 for exhausting a reactive gas is formed at the other end.

Description will now be made of the operation of the apparatus shown in FIG. 1. Specimens 4 such as semiconductor wafers are first set on the specimen supporting base 3. A reactive gas is then introduced into the container 1 through the gas inlet ports 7, as well as being expelled through the gas outlet port 8, and the treatment chamber 2 is thus filled with the reactive gas at a predetermined pressure. In this state, a high frequency voltage is applied between the electrodes 5a and 5b from the high frequency power source 6 to generate plasma in the treatment chamber 2.

At the same time, ions, electrons, activated neutral molecules and neutral atoms and the like are produced in the treatment chamber 2. These particles are subjected to physico-chemical reactions on the surfaces of the specimens 4 which are held on the specimen supporting base 3, etching or formation of a thin film thereby being performed.

The type of reactive gas used and the level of the high frequency voltage applied between the electrodes 5a and 5b will differ according to whether etching or thin film formation is to be conducted.

Since the specimens 4 are gradually electrified to a negative polarity by virtue of the injection of electrons in the plasma produced, however, some of the positive ions in the plasma are accelerated toward the specimens 4 and thus strike the surface of each of the specimens 4. Damage such as crystal defects therefore occurs on the etching surfaces of the specimens 4 during etching or in the thin film formed thereon during thin film formation. The apparatus shown in FIG. 1 thus involves a problem with respect to deterioration in the electrical characteristics of semiconductor devices which are produced using the specimens 4.

SUMMARY OF THE INVENTION

The present invention has been achieved with a view to solving the above-described problem, and it is an object of the present invention to provide a method and an apparatus for plasma treatment which is capable of controlling the occurrence of specimen damage owing to the injection of ions present in the plasma.

To achieve this object, the method for plasma treatment in accordance with the present invention comprises the steps of forming a mirror field which faces a surface of a specimen to be treated and which has its field axis parallel to the surface of the specimen in an atmosphere of a reactive gas, generating a plasma of the reactive gas by introducing a microwave into a region where the mirror field is formed, the plasma being confined in the mirror field, and treating the specimen by supplying activated neutral particles to the surface of the specimen.

The apparatus for plasma treatment in accordance with the present invention comprises a treatment container, a gas supply means for supplying a reactive gas into the treatment container, a specimen holding means for holding a specimen in the container, a field formation means for forming a mirror field which faces a surface of the specimen to be treated, the mirror field having its field axis disposed parallel with the surface of the specimen in the treatment container, and a plasma generating means for generating a plasma of the reactive gas by introducing microwaves into the mirror field formed by the field formation means.

DESCRIPTION OF THE PREFERRED EMBODIMENT

An embodiment of the present invention is described in detail below with reference to the attached drawings.

Figure 1:
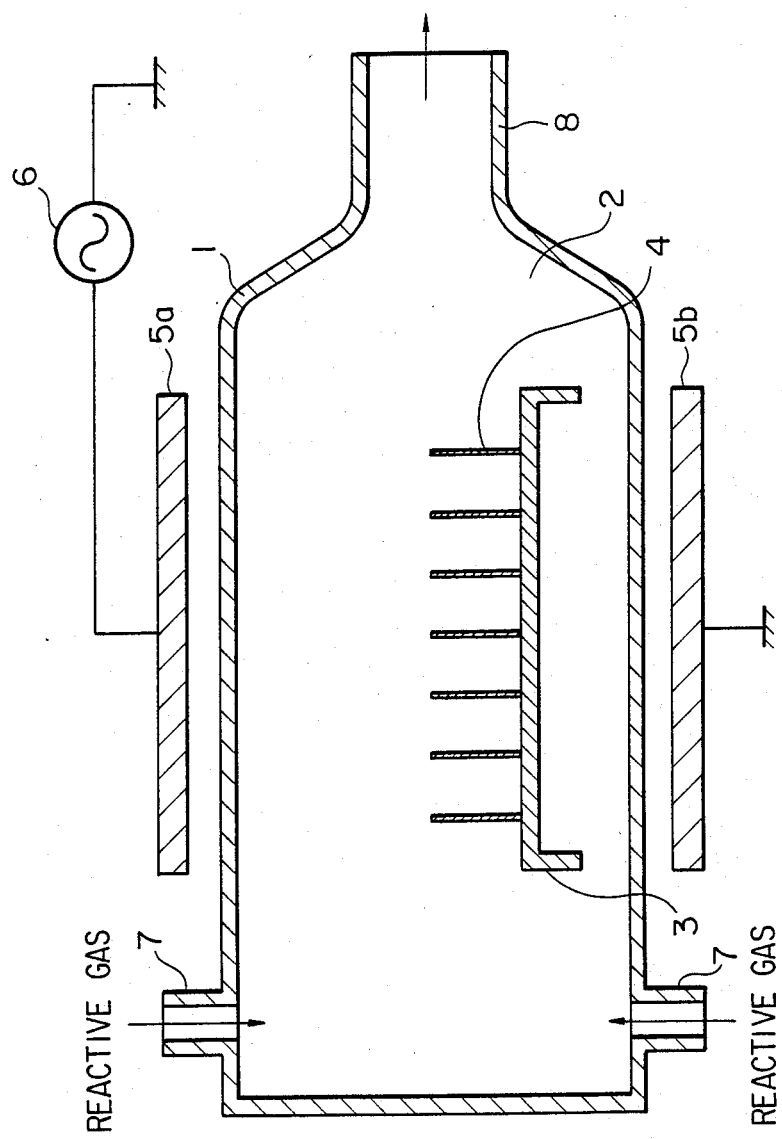
FIG. 1 is a sectional view of a conventional apparatus for plasma treatment.
Figure 2:
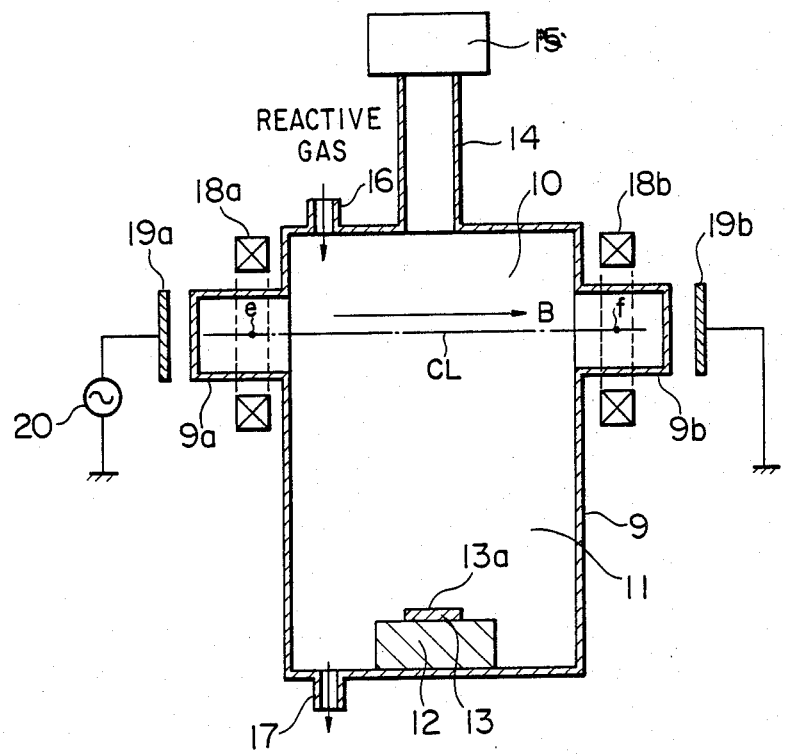
FIG. 2 is a sectional view of an apparatus for plasma treatment in accordance with an embodiment of the present invention.

In FIG. 2, an apparatus for plasma treatment has a cylindrical treatment container 9 with closed upper and lower ends. This container 9 has a pair of hollow projections 9a and 9b which radially outwardly project from upper portions of the side surfaces thereof at diametrically opposite locations. A plasma formation chamber 10 is defined in an upper portion of the container 9 and includes the inside spaces of these projections 9a and 9b, and a specimen chamber 11 is defined in a lower portion of the container 9. A specimen holding base 12 on which a specimen 13 is mounted is provided at the bottom of the container 9, and a microwave source 15 is connected to the upper end of the container 9 through a hollow wave guide 14. A gas inlet port 16 and a gas outlet port 17 are also provided at the upper and lower ends, respectively, of the container 9, a gas supply means (not shown) being connected to the gas inlet port 16 and an exhauster (not shown) being connected to the gas outlet port 17.

A pair of electromagnetic coils 18a and 18b are respectively disposed around the peripheries of the projections 9a and 9b of the container 9 in such a manner that the adjacent coil end surfaces thereof face each other. These electromagnetic coils 18a, 18b have a common axis CL which is parallel to a principal surface 13a of the specimen 13 to be treated which is mounted on the specimen holding base 12. A coil power source (not shown) is electrically connected to the electromagnetic coils 18a and 18b.

A pair of electrodes 19a and 19b are respectively disposed on the outside of the projections 9a and 9b of the container 9 so as to oppose each other on the axis CL of the electromagnetic coils 18a and 18b and to be perpendicular to the axis CL. A high frequency power source 20 is electrically connected to the electrodes 19a and 19b.

Description will now be given of a method of etching removal of an organic film, for example, removal of a resist, using the apparatus of this embodiment.

The specimen 13 such as a semiconductor wafer or the like is first set on the specimen holding base 12. After the air in the container 9 has been expelled by the unillustrated exhauster through the gas outlet port 17 so that the pressure therein is $1 \times 10^{-5}$ Pa or less, the reactive gas, such as $O_2$, is introduced into the container 9 from the unillustrated gas supply means through the gas inlet port 16, while being exhausted through the gas outlet port 17. As a result, the plasma formation chamber 10 and the specimen chamber 11 are filled with the reactive gas at a pressure of about $5 \times 10^{-1}$ Pa.

Figure 3:
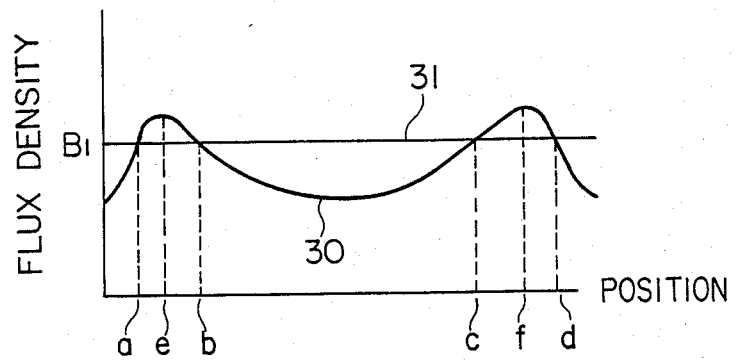
FIG. 3 is a graph showing the strength of the magnetic field formed on the common axis of electromagnetic coils disposed in a plasma formation chamber.

In this state, a voltage of 20 V is applied to the electromagnetic coils 18a and 18b from the unillustrated coil power source, and a current of 110 A is caused to flow through these coils in the same direction to form a mirror field B which has its field axis disposed in coincidence with the axis CL of the coils 18a and 18b in the plasma formation chamber 10. The strength of the mirror field B on the axis CL of the electromagnetic coils 18a and 18b in the above-described state is shown by a curve 30 in FIG. 3. In FIG. 3, e and f denote the positions of the electromagnetic coils 18a and 18b, respectively.

Microwave energy is then introduced into the plasma formation chamber 10 from the microwave source 15 shown in FIG. 2 through the wave guide 14. The strength of the mirror field B and the frequency of the microwaves are so determined that the required conditions of electron cyclotron resonance produced by the microwaves are established in the plasma formation chamber 10. For example, when the conditions of electron cyclotron resonance are satisfied at a flux density of $B_1$ for microwaves having a frequency $f_1$, the electron cyclotron resonance occur at the positions at which the curve 30 intersects a straight line 31 representing the flux density B1 in FIG. 3, i.e., positions a, b, c and d in the plasma formation chamber 10. FIG. 3 however shows only a two-dimensional strength distribution for the field on the axis CL of the electromagnetic coils 18a and 18b. A surface where the electron cyclotron resonance occurs is in fact formed at each of the positions shown by a, b, c and d.

The electrons in the molecules of the reactive gas which is introduced into the plasma formation chamber 10 thus absorb energy from the microwaves and cause the gas molecules to be ionized on the surfaces where the electron cyclotron resonance occurs. In this way, plasma of the reactive gas is formed in the plasma formation chamber 10. At this time, charged particles in the plasma such as ions and electrons are confined by the mirror field B which is formed in the plasma formation chamber 10, and only neutral activated particles produced by the plasma spring out from the mirror field B. Part of the neutral particles which are released from the plasma formation chamber 10 to the specimen chamber 11 reach the principal surface 13a of the specimen 13 held on the specimen holding base 12 where physico-chemical reaction takes place to perform etching of the principal surface 13a of the specimen.

As described above, in this embodiment, since the injection of ions and electrons in the plasma into the specimen 13 is prevented, etching can be effected without producing any damage.

The formation of a high frequency electrical field in the plasma formation chamber 10 using the electrodes 19a, 19b and the high-frequency power source 20 improves the degree of ionization of the plasma. In other words, a high frequency power having, for example, a frequency of 13.56 MHz and a power of 250 W, is applied between the electrodes 19a and 19b by the high-frequency power source 20 to form a high-frequency field along the field axis CL of the mirror field B. This high frequency field allows the electrons in the plasma to be subjected to a force which has a direction along the field axis CL shown in FIG. 2 and to possess a great component of motion in this direction. This has the effect of increasing the number of times these electrons cross the surfaces where the electron cyclotron resonance occurs in the plasma formation chamber 10 per unit of time. The efficiency with which the electrons absorb energy from the microwaves is consequently increased, whereby highly ionized plasma can be obtained. The number of neutral particles which react on the surface of the specimen 13 is therefore increased, and etching can thus be accelerated.

When, instead of etching a resist, a surface cleaning treatment is performed for the purpose of removing a polymer film formed during reactive ion etching, $NF_3 + He$ may be used in place of $O_2$ as the reactive gas. Etching of various types of films can be performed by the same method as that described above. By appropriately selecting the type and pressure of the reactive gas, the level of the power applied to the electromagnetic coils 18a and 18b, the frequency of the microwaves and the like in the same manner as with etching, a thin film can also be formed which shows no or little damage. In this case, if a high-frequency field is developed in the plasma formation chamber 10 by using the electrodes 19a and 19b and the high-frequency power source 20, a thin film can be formed at high speed.

Although the above-described embodiment utilizes the electromagnetic coils 18a and 18b and the electrodes 19a and 19b which are all disposed outside the container 9, they may alternatively be disposed inside the container 9.

The mirror field B may be formed by using a pair of permanent magnets in place of the electromagnetic coils 18a and 18b.

In addition, although the above-described embodiment is provided with only one specimen 13 which is held by the specimen holding base 12, a plurality of specimens 13 can be held and simultaneously subjected to plasma treatment.

What is claimed is:

1. A method for plasma treatment comprising the steps of:
   forming a mirror field which faces a surface of a specimen to be treated and which has its field axis parallel to said surface in an atmosphere of a reactive gas;
   generating a plasma of said reactive gas by introducing a microwave energy into a region where said mirror field is formed, said plasma being confined in said mirror field; and
   treating said specimen by supplying activated neutral particles which are produced by said plasma to said surface of said specimen.

2. A method according to claim 1, wherein said specimen is a semiconductor wafer.

3. A method according to claim 1, wherein said treatment of said specimen is etching.

4. A method according to claim 1, wherein said treatment is the formation of a thin film.

5. A method for plasma treatment according to claim 1, further comprising forming an electric field in the direction along the field axis of said mirror field in a region where said plasma is generated.

6. An apparatus for plasma treatment comprising:
a treatment container;
gas supply means for supplying a reactive gas into said treatment container;
specimen holding means for holding a specimen in said treatment container;
field formation means for forming a mirror field which faces a surface of said specimen to be treated, said mirror field having its field axis disposed parallel to said surface of said specimen in said treatment container; and
plasma generation means for generating a plasma of said reactive gas by introducing microwave energy into said mirror field formed by said field formation means.

7. An apparatus according to claim 6, wherein said field formation means is disposed outside said treatment container.

8. An apparatus according to claim 6, wherein said field formation means is disposed inside said treatment container.

9. An apparatus according to claim 6, wherein said field formation means comprises a pair of electromagnetic coils.

10. An apparatus according to claim 6, wherein said field formation means comprises a pair of permanent magnets.

11. An apparatus according to claim 6, wherein said mirror field formed by said field formation means and said microwave energy introduced by said plasma generation means respectively have such a strength and a frequency at which electron cyclotron resonance occurs in said treatment container.

12. An apparatus according to claim 6, further comprising an electric field formation means for forming an electric field in the direction along said field axis of said mirror field formed by said field formation means in a region where said plasma is generated.

13. An apparatus according to claim 12, wherein said electric field formed by said electric field formation means is a high frequency electric field.

14. An apparatus according to claim 13, wherein said electric field forming means comprises a pair of electrodes disposed so as to sandwich said region where said plasma is formed, and a power source for applying a high-frequency voltage between said pair of electrodes.

15. An apparatus according to claim 14, wherein said pair of electrodes are disposed outside said treatment container.

16. An apparatus according to claim 14, wherein said pair of electrodes are disposed inside said treatment container.

* * * * *